United States Patent [19]
Pfouts

[11] 3,942,111
[45] Mar. 2, 1976

[54] METHOD AND APPARATUS FOR TESTING ELECTRIC MOTORS

[75] Inventor: John Richard Pfouts, Mount Victory, Ohio

[73] Assignee: Whirlpool Corporation, Benton Harbor, Mich.

[22] Filed: Nov. 18, 1974

[21] Appl. No.: 524,493

[52] U.S. Cl. .......................... 324/158 MG; 318/490
[51] Int. Cl.² ......................................... G01R 31/02
[58] Field of Search ................ 324/158 MG, 158 R; 318/490; 322/99

[56] References Cited
UNITED STATES PATENTS
2,741,738   4/1956   Reid ............................ 324/158 MG
3,004,205   10/1961   Barritt et al. ....................... 318/490
FOREIGN PATENTS OR APPLICATIONS
182,231   10/1966   U.S.S.R. ...................... 324/158 MG

*Primary Examiner*—R. V. Rolinec
*Assistant Examiner*—Ernest F. Karlsen
*Attorney, Agent, or Firm*—Wegner, Stellman, McCord, Wiles & Wood

[57] ABSTRACT

To determine whether a motor is operative, where visual inspection of rotation is impossible or difficult, the motor is energized by connection to an AC source for a short interval to bring the motor to running speed. After lapse of the short interval, the AC source is disconnected and the motor coasts to a stop. An AC detector determines that AC power has been terminated and closes a switch to connect a voltage detector to a memory. The voltage detector amplifies an EMF generated while the motor is acting as a generator as the motor coasts to a stop. The detected voltage sets the memory which energizes a motor rotation indicator. For improved accuracy in the determination of the operativeness of the motor, the motor is caused to be tested a plurality of times as the result of a single operation of a control member by the test operator. To further facilitate the testing operation, the control is arranged to provide a signal to the testing operator effectively positively indicating the operativeness of the motor while yet permitting the operator to have his visual attention elsewhere. A time delay is provided in the provision of the indication signals effectively preventing spurious indications.

28 Claims, 2 Drawing Figures

METHOD AND APPARATUS FOR TESTING ELECTRIC MOTORS

BACKGROUND OF THE INVENTION

1. Field of the Invention

This invention relates to the testing of electric motors and more specifically to a method and apparatus for testing electric motors for facilitated determination of the operativeness thereof.

2. Description of the Prior Art

During final production testing of an electric motor, visual inspection of rotation of the motor may be impossible or difficult for a variety of reasons. For example, rotation of an output shaft of a timing motor which drives a step-down gear train may be imperceptible over a short time period during which testing should be accomplished. It would be desirable to provide a testing method and apparatus which can determine, in an extremely short time interval, whether an electric motor is operative or inoperative. To maintain a high rate of production, the method must be simple and desirably should require no connection to the output shaft.

It has been known to utilize the residual magnetic field of an electric motor to operate an indicator to indicate that an appliance has completed a cycle. An example of such a device is disclosed in U.S. Pat. No. 3,004,205, issued Oct. 10, 1961, to Barritt and Fuqua, and assigned to the assignee of the present application. In the Barritt et al patent, the end of the cycle of an automatic clothes dryer is signaled by an audible indication which is generated in response to the momentary transient voltage induced in the winding of an electric motor by residual decaying circulating rotor currents existing in the rotating rotor immediately following de-energization of the motor.

The present invention comprises a further improvement in this art over that of the copending application of Donald E. Knoop and Rodney F. Seeland, Ser. No. 524,494, filed Nov. 18, 1974, and owned by the assignee hereof. In said copending application, test apparatus is disclosed and a visual indicator is provided in the test apparatus for indicating the operativeness of the motor being tested. Further, a manually operable control member is provided permitting the operator to effect a test of the motor by automatically bringing the motor to a running condition and de-energizing the motor to determine the existence of the running condition by a suitable indication thereof produced by an EMF generated by the motor as it comes to a stop from the running condition.

SUMMARY OF THE INVENTION

As discussed above, in the copending Knopp et al application, a new method of testing electric motors is disclosed which uses the known property that an EMF is generated by a de-energized motor as it is coasting to a stop. The method of said application includes initially energizing the motor for a short testing interval, which is sufficient to allow the motor rotor to come to operating speed. Upon termination of this testing interval, the motor is de-energized and a voltage detector is responsive to the generated EMF, if present, to set a memory so as to record the operative, or inoperative, condition of the motor.

The present invention comprehends an improved method and apparatus for testing a motor utilizing the generated EMF signal wherein the testing operator may effect a plurality of sequential tests of the motor by a single manipulation of the control member thereby substantially improving the accuracy in the determination of the operativeness of such motors with substantially improved facility. Further, to improve the facility of the testing operation, the indicating means herein includes means permitting the testing operator to have his visual attention directed elsewhere during the testing operation while yet providing an effectively positive indication of the operativeness of the motor being tested. Improved means for effecting a time delay in the indication of the operativeness of the motor being tested are further provided for providing improved accuracy in the testing operations.

BRIEF DESCRIPTION OF THE DRAWING

Other features and advantages of the invention will be apparent from the following description taken in connection with the accompanying drawing wherein.

DESCRIPTION OF THE PREFERRED EMBODIMENT

Figure 1A:
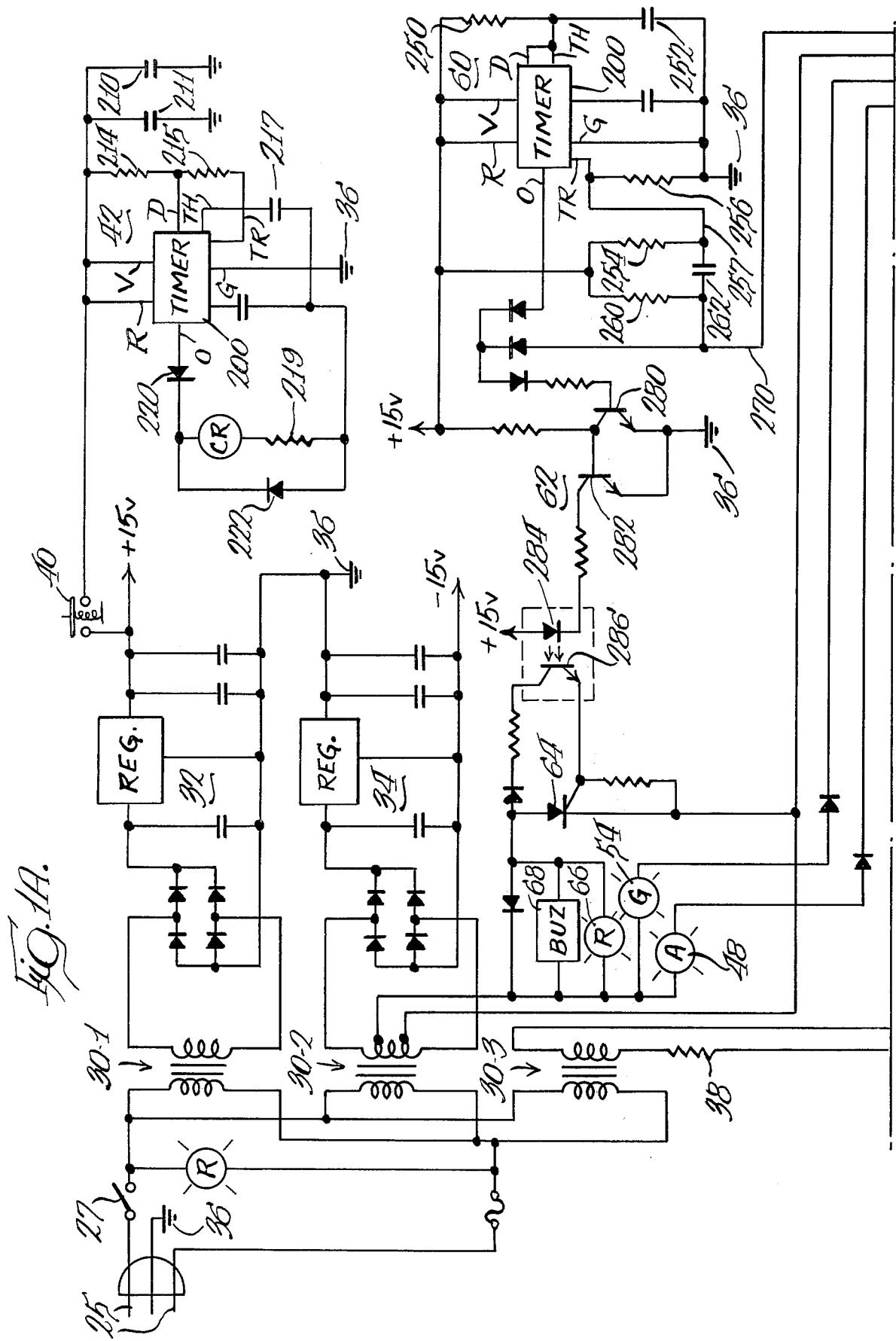
FIGS. 1A and 1B comprise a two-sheet schematic wiring diagram of a testing apparatus embodying the invention utilized in performing a method embodying the invention of testing electrical motors.
Figure 1B:
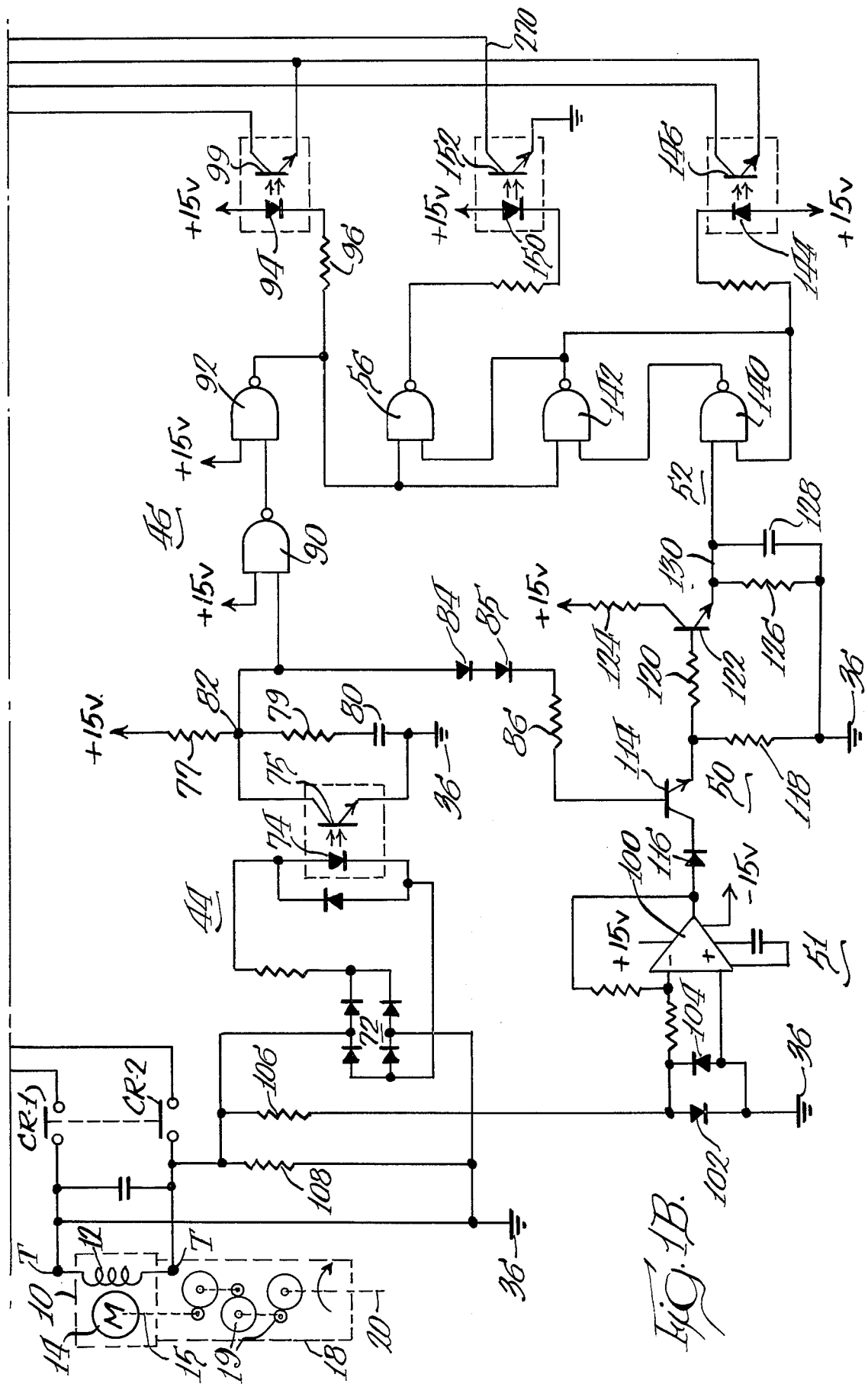

In the exemplary embodiment of the invention as disclosed in the drawing, an electric motor 10 to be tested includes at least one stator winding 12 and a rotor 14 which rotates a motor shaft 15 upon connection of the winding 12 to a 115 volt AC source. In the illustrative embodiment, motor 10 comprises a small fractional-horsepower, single phase AC timer motor such as utilized in timing devices for appliances or for clocks. Connected to the motor shaft 15 is a step-down gear train 18 comprised of a plurality of speed reducing gears 19 which rotate an output shaft 20. The speed of rotation of output shaft 20 may be extremely slow, and this rotation may be imperceptible over a short time interval of several seconds. Visual determination of the rotation of the output shaft 20 may be very difficult, if not impossible as where the motor is located in a utilization device.

Electric motor 10 may take a variety of forms, and may include additional windings and a start capacitor or the like for initiating rotation when connected across a single phase AC source. In fact, the testing method is applicable with three-phase AC motors of substantial size, and in general, has utility wherever rotation of an electric motor cannot be determined readily or quickly by visual inspection upon energization of the electric motor. The testing method is also applicable to electric motors which do not have a connected gear train, but do have a low shaft rpm, or are located in a device, such as an appliance, so as to make impossible or difficult visual determination of the output rotation.

The present invention comprehends an improved apparatus for testing such motors which provides facilitated determination of the operativeness of the motor. The invention further comprehends the provision of such a testing apparatus and method wherein the efficiency of the operator is substantially increased by permitting the operator to carry on a number of operations at the same time so as to adapt the apparatus and method for mass production techniques in the facilitated determination of the operativeness of a large number of motors seriatim.

As shown in the drawing, the test appartus is energized from a conventional source 25 of 115 volts AC. The power source is coupled through a master on-off switch 27 to two step-down transformers 30 labeled 30-1, 30-2, and an isolation transformer labeled 30-3, to energize the circuit which includes a +15 volt DC power supply 32 and a −15 volt power supply 34, both of which supply regulated DC voltage with respect to a source of reference potential or ground 36. Transformer 30-3 couples the 115 volt AC through a resistor 38 and through a pair of normally open relay contacts CR-1 and CR-2 to test clips T which are connected across the winding 12 of the motor.

A control member or test switch 40, herein illustratively comprising a spring biased momentary contact pushbutton switch, is provided for manually effecting the desired motor test. When test switch 40 is maintained in a depressed condition, the regulated +15 volts is coupled to a continuous cycle timer circuit 42 which provides a two-second on, two-second off cycle for energizing a DC control relay CR. When timer circuit 42 turns on, as will be explained, +15 volts DC is coupled through an output line 0 to relay CR, thereby energizing the relay and closing contact CR-1 and CR-2 to connect AC voltage to the motor 10 being tested. The AC voltage impressed across the motor winding 12 is also detected by an AC detector 44 and energizes a buffer and inverter 46 in order to energize a test-in-progress visual indicator 48, labeled A. The output of AC detector 44 also disables a switch 50 which, in effect, disables a voltage detector 51. After a short test interval t, which is sufficient for the motor rotor speed to approach operating speed, the timer circuit 42 de-energizes relay CR and opens the contacts CR-1 and CR-2 to disconnect power from the electric motor 10.

The AC detector 44 now enables the switch 50 so as to connect the voltage detector 51 to a memory flip-flop 52. If the rotor was rotated, a residual EMF is now produced as the residual magnetism of the rotor generates a voltage in the stator windings while the rotating rotor 14 is coasting to a halt. During this time period, motor 10 acts as a generator. The generated output voltage of the motor 10 is now detected and amplified by the voltage detector 51 to set the flip-flop 52, thereby enabling a "run" visual indicator 54, labeled G. This provides a visual indication that the motor was operative when the AC power was connected thereto. As memory 52 remains enabled for a time period substantially in excess of the time duration of the residual voltage from the motor, an improved indication output is obtained.

Should the motor 10 happen to be inoperative, or should the gear train 18 have caused the rotor shaft 15 to stall, no voltage is generated and therefore voltage detector 51 does not set the flip-flop 52. As a result, both inputs to the NAND gate 56 would be zero bits, resulting in a one-bit output which is coupled to the trigger TR input of a single cycle timer circuit 60. The timer circuit 60, as will be explained, has a time delay of approximately one-half second, and then enables a driving circuit 62 to energize an SCR 64 in order to couple AC across a visual "stall" or "reject" indicator 66, labeled R, and an aural indicator comprising an audible buzzer 68, labeled BUZ.

As the reject circuit is energized for a short time, each time a test is completed, if it were not for the time delay circuit 60, the indicator 66 would indicate a bad motor and the buzzer alarm would sound each time. To prevent this, the electronic timer 60 disables the reject indicator light 66 and alarm 68 for approximately one-half second. At the end of this time delay, if the timer motor under test is defective, the reject indicator light 66 and audible alarm 68 are allowed to be energized. The use of two indicators including the audible alarm 68 facilitates the testing of such motors as the operator does not have to watch the indicator lights, but instead can listen for a reject alarm while his visual attention is elsewhere.

Considering the circuit in detail, AC detector 44 comprises a full-wave diode rectifier bridge 72 which passes both half-cycles of AC through a light emitting diode (LED) 74 to enable an optically coupled transistor 75. The collector of transistor 75 is coupled through a resistor 77 to the +15 volt regulated supply 32, and the collector-emitter are shunted by a resistor 79 and a capacitor 80, with the emitter being also coupled to ground 36. When transistor 75 is driven full on due to current flow through the LED 74, it, in effect, connects a junction 82 to ground and therefore reduces the voltage across capapitor 80. This low voltage is not sufficient to forward bias a diode string consisting of diodes 84 and 85 in series with a resistor 86 which is a part of the switch 50. Thus, the switch 50 remains in its cutoff condition.

While voltage at junction 82 is low, it provides a low input to a NAND gate 90 which forms a part of the buffer and inverter 46. The output of NAND gate 90 is coupled to the input of another NAND gate 92, and both NAND gates 90 and 92 have their other inputs coupled to a 1 bit source, such as +15 volts DC. The output of NAND gate 92 is coupled through a light emitting diode (LED) 94 and a resistor 96 to the +15 volt DC source. As the junction 82 is held low, the NAND gate 90 produces a 1 bit output which causes NAND gate 92 to have a low output which allows current flow through the LED 94. This causes an optically coupled transistor 99 to conduct and therefore to connect the lamp 38 across the AC source, enabling the lamp and producing a visual indication of a test-in-progress.

Voltage detector 51 includes an operational amplifier 100 having its minus (−) and plus (+) inputs coupled across a pair of oppositely poled diodes 102 and 104 which provide voltage limiting so that AC voltages in excess of the breakover potential of the diodes 102 and 104 will not be impressed across the inputs of operational amplifier 100. The (+) input of the operational amplifier input 100 is connected to ground 36. The (−) input is coupled through a resistor 106 to one side of winding 12. The same side of winding 12 is coupled through a resistor 108 to ground 36.

Switch 50 includes a switching transistor 114 having its base coupled to the resistor 86 of the diode string 84, 85, and its collector coupled through a diode 116 to the output of the operational amplifier 100. The emitter of transistor 114 is coupled through a resistor 118 to ground 36. The emitter is also coupled through a resistor 120 to the base of a switching transistor 122 having its collector coupled through a resistor 124 to +15 volts DC. The emitter of transistor 122 is coupled through a resistor 126 to ground 36. A noise filtering capacitor 128 also couples the emitter of transistor 128 to ground 36.

During the test-in-progress time interval t, the AC line voltage coupled to AC detector 44 is also being coupled to operational amplifier 100. The diodes 102 and 104 are voltage breakover devices which limit the voltage input to the operational amplifier to on the order of 0.6 volt. The resulting pulsating AC voltage is amplified and fed to the transistor 114, which receives no base drive while AC is coupled to the motor, because of the low voltage maintained at junction 82.

As the timer 42 times out, the AC voltage will disappear and the LED 74 no longer forward biases the transistor 75. This allows the voltage at junction 82 to rise positively to a sufficient extent to forward bias the diode string 84, 85 and forward bias the transistor 114. At the same time, the residual AC voltage being generated (if the motor rotor 14 has been rotating) is amplified by the amplifier 100 and passed through diode 116 to transistor 114. These conditions bias the transistors 114 and 122 to their fully saturated states, changing the output, after a short time delay produced by capacitor 128, on line 130 to low. This will enable the indicator 54, as will appear. Alternatively, should no residual EMF exist because of a faulty motor, or because of a stalled condition due to an inoperative gear train or the like, no input will be provided to the operational amplifier 100. Therefore, neither of the transistors 114 of 122 will conduct, and memory flip-flop 52 will not switch states to enable the indicator 54.

When the AC power is turned off, an AC spike may appear across the winding 12, and since this spike will appear whether the motor is good or bad, it could provide a false indication by falsely triggering the flip-flop 52. To prevent this from occurring, the capacitor 128 is provided to provide a delay which will filter out any noise spikes or the like which occur when AC power is disconnected from across the winding of the AC motor.

As the switch 50 is driven on due to junction 82 rising to a high voltage, the NAND gate 90 switches to a 0 bit output which switches NAND gate 92 to a 1 bit output. This blocks current flow through the LED 94 and thus disables energization of the lamp indicator 48 in order to indicate that the test is no longer in progress.

Flip-flop 52 consists of a pair of cross-coupled NAND gates 140 and 142, in which NAND gate 140 has a set input coupled to the output line 130 of the switch 50. A reset input of NAND gate 142 is coupled to the output of NAND gate 92. When the line 130 has a low input due to switch 50 being on while a residual AC voltage is detected, the output of NAND gate 142 therefore changes to a 0 bit. This allows current flow through a light emitting diode (LED) 144 so as to trigger an optically coupled transistor 146 into conduction and thereby couple AC power across the lamp 54. This provides a run indication which remains enabled for a substantially long time period, until the flip-flop 52 is reset due to the output of NAND gate 92 going low which occurs when the timer 42 again connects AC power across the motor.

Should no residual EMF be detected as AC power is removed, then transistor 122 will not be saturated and the output of NAND gate 142 will remain a 1 bit which prevents current flow through the LED 144. This 1 bit is coupled to NAND gate 56 which also has an input from the NAND gate 92. Because AC power is no longer being applied, the output of NAND gate 92 will go to a 1 bit, creating a 0 bit output from NAND gate 56 which allows current flow through a light emitting diode (LED) 150. The LED 150 is optically coupled to trigger a transistor 152 in order to energize timer 60 and then lamp 66 and buzzer 68.

Timer circuits 42 and 60 will now be considered in detail. Both timers use a standard timer integrated circuit 200 such as a Signetics NE555V timer which has a ground input G, a trigger input TR which utilizes negative going pulses, an output 0 which generates positive going pulses at +15 volts, a reset input R which is effectively not utilized in the present circuit, a + DC voltage input V, a threshold input TH, and a discharge input D.

When test switch 40 is held closed, +15 volts is switched through input V of the timer 200 in timing circuit 42 in order to generate 2 second on, 2 second off, cycles for enabling control relay CR. A pair of capacitors 210, 211 filter the +15 volts. A pair of resistors 214 and 215 are connected between +15 and the trigger input TR. The threshold input TH is coupled through a capacitor 217 and a resistor 219 to the control relay CR. The control relay may be a twelve volt relay and thus the resistor 219 which may have a very low value is utilized to drop the remaining voltage since the timer output 0 will couple +15 volts through a diode 220 to the control relay CR. A diode 222 is connected across the serial combination of control relay CR and resistor 219 to absorb any voltage spike generated by the current decay in relay coil CR.

As test switch 40 is closed, current travels through resistors 214 and 215 to enable the timer 200. This allows capacitor 217 to charge until reaching a predetermined voltage internally within the timer 200. At such time, the capacitor 217 discharges current out terminal D and through resistor 215. The time constants are selected to have a 2-second on, 2-second off cycle. During each on cycle, relay CR is energized, and during each off cycle, relay CR is de-energized, When the operator releases switch 40, the timer becomes de-energized and disconnects power across the motor 10. In previous such timer motor testers, it was necessary for the operator to press the test switch button to apply power to the timer motor and to release the button to sense if it had actually run. In order to test the motor a number of times, it was necessary for the operator to press and release the test switch sequentially.

Herein, the timer 42, controlled by the test switch 40, is utilized to apply and remove power to the timer motor under test. The operator holds the switch test closed and power is automatically seriatim applied and removed. The sequential power application continues for as long as the test switch is held closed by the operator. When the test switch is released, power is removed from the motor being tested instantly, whereby the operator may safely disconnect the test clips.

The single cycle timer 60 will now be considered in detail. The +15 volts is coupled directly to inputs R and V, and through a resistor 250 and a capacitor 252 to ground 36. The +15 volts is also coupled through a resistor 254, such as 1.2 megohms, and a resistor 256 of the same value, such as 1.2 megohms, to ground 36. The junction 257 between the resistors 254 and 256 is coupled to the trigger input TR. A resistor 260 connected to a capacitor 262 shunts the resistor 254. When a stall condition occurs, transistor 152 is enabled and this effectively grounds an output line 270, creating a negative going signal through capacitor 262 which is coupled to the trigger in-put TR to enable the timer 200. When not enabled, the timer holds the capacitor 252 to O potential thereacross. Upon triggering, the capacitor 252 is unclamped and allowed to charge. When the capacitor reaches a reference voltage as determined internally within the timer 200, the capacitor 252 is allowed to discharge and the timer now remains disabled and holds the capacitor 252 clamped to O potential. The time constants are selected to produce approximately one-half second time delay.

Approximately one-half second after triggering to a stall indication, +15 volts is switched to output O and is coupled to reverse bias a transistor 280. This turns on a transistor 282 and thus allows current to flow through a light emitting diode (LED) 284. This forward biases an optically coupled transistor 286 to connect one-half cycle AC to the gate of SCR 64, gating the SCR into conduction in order to energize the stall indicator 66 and the buzzer 68.

Thus, the motor testing method described above is readily adaptable to automated testing of motors. As no visual inspection is needed, the motor can be tested by automatic means. As will be obvious to those skilled in the art, the sensed signal which indicates whether the motor is operable or not, can be used to actuate suitable conventional equipment for separating defective motors from the group being tested.

The foregoing disclosure of specific embodiments is illustrative of the broad inventive concepts comprehended by the invention.

Having described the invention, the embodiments of the invention in which an exclusive property or privilege is claimed are defined as follows:

1. A method of testing an electric motor having a residual magnetic field such that upon de-energization of the running motor an EMF is produced in the windings of the motor, said method comprising the steps of: effecting a single manipulation of a control member to a test position; causing a series of preselected short time duration energizations and de-energizations of the motor as a result of said single manipulation of the control member, said de-energization having a time duration of preselected length; selectively causing an indication of the presence of said EMF during each de-energization of the motor; and causing the control member to go to a nontest position subsequent to a preselected number of said series of energizations and deenergizations having taken place.

2. The method of testing an electric motor of claim 1 wherein the energizations of the motor are caused to have a time duration substantially equal to those of said de-energizations.

3. The method of testing an electric motor of claim 1 wherein each of the de-energization time durations is the same.

4. The method of testing an electric motor of claim 1 wherein said preselected length is approximately two seconds.

5. The method of testing an electric motor of claim 1 wherein the control member is positionable to cause the connections to the motor to be instantly de-energized for immediate disconnection thereof from the motor by an operation.

6. The method of testing an electric motor of claim 1 wherein the manipulation of the control member to the nontest position causes the motor to be instantly de-energized.

7. The method of testing an electric motor of claim 1 wherein a different indication is provided in the event the motor failed to operate during the energizations thereof.

8. The method of testing an electric motor of claim 1 wherein said indication is delayed a preselected period of time upon de-energization of the motor less than said preselected length of the de-energization time duration.

9. The method of testing an electric motor of claim 1 wherein said control member is caused to go to the nontest position by a release thereof.

10. The method of testing an electric motor of claim 7 wherein said different indication comprises a signal preselected to permit the test operator to be looking in any direction while yet effectively positively indicating to the test operator the non-operation of the motor during said energizations.

11. A method of testing an electric motor having a residual magnetic field such that upon de-energization of the running motor an EMF is produced in the windings of the motor, said method comprising the steps of: effecting a single manipulation of a control member to a test position; causing a series of preselected short time duration energizations and de-energizations of the motor as a result of said single manipulation of the control member; selectively causing at least two different indications of the running of the motor as a result of the energization thereof; and causing the control member to go to a nontest position subsequent to a preselected number of said series of energizations and de-energizations having taken place.

12. The method of testing an electric motor of claim 11 wherein the energizations of the motor are caused to have a time duration substantially equal to those of said de-energizations.

13. The method of testing an electric motor of claim 11 wherein the control member is positionable to cause the connections to the motor to be instantly de-energized for immediate disconnection thereof from the motor by an operation.

14. The method of testing an electric motor of claim 11 wherein said indication is delayed a preselected period of time upon de-energization of the motor less than said preselected length of the de-energization time duration.

15. An apparatus for testing an electric motor having a residual magnetic field such that upon de-energization of the running motor an EMF is produced in the windings of the motor, said apparatus comprising:
 a control member selectively positionable in a test position and a nontest position;
 control means operable as a result of a single manipulation of the control member to said test position for causing a series of energizations and de-energizations of the motor, said de-energizations having a time duration of short preselected length;
 indicator means for causing an indication of the presence of said EMF during each de-energization of the motor;
 indicator means for causing an indication of the absence of said EMF during each de-energization of the motor; and
 means for de-energizing the motor as an incident of the control member being positioned in the nontest position subsequent to said series of energizations and deenergizations.

16. The motor testing apparatus of claim 15 wherein said control means comprises means for causing the time duration of said energizations to be the same as that of said de-energizations.

17. The motor testing apparatus of claim 15 wherein said control means includes means for delaying the indication of said EMF during the de-energization time duration.

18. The motor testing apparatus of claim 15 wherein said indicator means for indicating the absence of said EMF during each energization of the motor comprises means for providing a nonvisual indication.

19. The motor testing apparatus of claim 15 wherein said indicator means for indicating the absence of said EMF during each energization of the motor comprises means for providing an aural indication.

20. The motor testing apparatus of claim 15 wherein said indicator means for indicating the absence of said EMF during each energization of the motor comprises means for providing an aural indication and a visual indication.

21. The motor testing apparatus of claim 15 wherein said indicator means for indicating the absence of said EMF during each energization of the motor comprises means for concurrently providing an aural indication and a visual indication.

22. The motor testing apparatus of claim 15 wherein said preselected time duration length is approximately 2 seconds.

23. The motor testing apparatus of claim 15 wherein said preselected time duration length is approximately 2 seconds and said control means includes means for delaying the indication of said EMF approximately one-half second during the de-energization time duration.

24. An apparatus for testing an electric motor having a residual magnetic field such that upon de-energization of the running motor an EMF is produced in the windings of the motor, said apparatus comprising:
- a control member selectively positionable in a test position and a nontest position;
- control means operable as a result of a single manipulation of the control member for causing a series of energizations and de-energizations of the motor;
- first indicating means for causing a visual indication of the absence of said EMF during de-energization of the motor; and
- second indicating means for concurrently causing an aural indication of the absence of said EMF during deenergization of the motor.

25. The motor testing apparatus of claim 24 wherein said control means includes means for delaying the indication of said indicating means.

26. The motor testing apparatus of claim 24 further including a third indicating means for indicating the energization of the motor.

27. The motor testing apparatus of claim 24 further including a third indicating means for indicating a running operation of the motor.

28. The motor testing apparatus of claim 24 further including a third indicating means for visually indicating a running operation of the motor.

* * * * *